(12) United States Patent
Tamura

(10) Patent No.: US 7,034,792 B2
(45) Date of Patent: *Apr. 25, 2006

(54) RAM-INCORPORATED DRIVER, AND DISPLAY UNIT AND ELECTRONIC EQUIPMENT USING THE SAME

(75) Inventor: Tsuyoshi Tamura, Hara-mura (JP)

(73) Assignee: Seiko Epson Corporation, Tokyo (JP)

(*) Notice: Subject to any disclaimer, the term of this patent is extended or adjusted under 35 U.S.C. 154(b) by 533 days.

This patent is subject to a terminal disclaimer.

(21) Appl. No.: 09/911,409

(22) Filed: Jul. 25, 2001

(65) Prior Publication Data

US 2002/0018058 A1 Feb. 14, 2002

Related U.S. Application Data

(63) Continuation of application No. PCT/JP00/08397, filed on Nov. 29, 2000.

(30) Foreign Application Priority Data

Nov. 29, 1999 (JP) .................................. 11-338146
Jul. 12, 2000 (JP) .............................. 2000-211080

(51) Int. Cl.
    *G09G 3/36* (2006.01)
(52) U.S. Cl. ...................................... 345/98; 345/100
(58) Field of Classification Search ................ 345/3.1, 345/1.1, 2.3, 98, 99, 100, 204; 455/566; 348/14.1, 14.14, 14.15, 14.13
    See application file for complete search history.

(56) References Cited

U.S. PATENT DOCUMENTS

| 5,287,485 | A |   | 2/1994 | Umina et al. ............... 711/120 |
|---|---|---|---|---|
| 5,400,052 | A | * | 3/1995 | Otake et al. ................ 345/667 |
| 5,444,458 | A | * | 8/1995 | Ishikawa ....................... 345/98 |
| 5,493,329 | A | * | 2/1996 | Ohguchi .................... 348/14.13 |
| 5,546,104 | A | * | 8/1996 | Kuga ............................ 345/99 |
| 5,623,624 | A |   | 4/1997 | Holland et al. ............. 395/432 |
| 5,726,677 | A |   | 3/1998 | Imamura ....................... 345/99 |

(Continued)

FOREIGN PATENT DOCUMENTS

EP           0 852 371 A1     7/1998

(Continued)

OTHER PUBLICATIONS

U.S. Appl. No. 09/911,829, filed Jul. 25, 2001, Tsuyoshi Tamura.

*Primary Examiner*—Xiao Wu
*Assistant Examiner*—Kevin M. Nguyen
(74) *Attorney, Agent, or Firm*—Oliff & Berridge, PLC

(57) ABSTRACT

The present invention provides a RAM-incorporated driver that enables the writing of moving-image data to a RAM simultaneously with the writing of still-image data to the RAM. The RAM-incorporated X-driver IC can include first and second bus lines for transferring still-image data and moving-image data from an MPU, a RAM for storing the still-image data and moving-image data, first column and page address control circuits for specifying column and page addresses in RAM for writing still-image data, second column and page address control circuits for specifying column and page addresses in RAM for writing moving-image data, an MPU-related control circuit for controlling each of the address control circuits, based on commands from the MPU, a display address control circuit for controlling the reading of still-image data and moving-image data stored in the RAM, as display data, and a driver-related control circuit for controlling the display address control circuit.

12 Claims, 13 Drawing Sheets

U.S. PATENT DOCUMENTS

| | | | |
|---|---|---|---|
| 5,815,136 A * | 9/1998 | Ikeda et al. | 345/98 |
| 5,990,860 A | 11/1999 | Takeuchi | 345/667 |
| 6,137,466 A * | 10/2000 | Moughanni et al. | 345/99 |
| 6,310,596 B1 * | 10/2001 | Takasugi | 345/98 |
| 6,329,973 B1 * | 12/2001 | Akimoto et al. | 345/98 |
| 6,335,728 B1 * | 1/2002 | Kida et al. | 345/204 |
| 6,340,959 B1 * | 1/2002 | Inamori | 345/3.1 |
| 2001/0017628 A1 | 8/2001 | Sunaga | 345/571 |

FOREIGN PATENT DOCUMENTS

| | | |
|---|---|---|
| JP | 61-99189 | 5/1986 |
| JP | 04219791 A | 8/1992 |
| JP | 05257463 A | 10/1993 |
| JP | 06-130910 | 5/1994 |
| JP | 07-092953 | 4/1995 |
| JP | 9-34426 | 2/1997 |
| JP | 09-034426 | 2/1997 |
| JP | 09-281933 | 10/1997 |
| JP | 11242463 A | 9/1999 |
| WO | WO97/11447 | 3/1997 |
| WO | WP 00/60570 | 10/2000 |

* cited by examiner

RAM-INCORPORATED DRIVER, AND DISPLAY UNIT AND ELECTRONIC EQUIPMENT USING THE SAME

BACKGROUND OF THE INVENTION

Japanese Patent Application No. 11-338146, filed Nov. 29, 1999, is hereby incorporated by reference in its entirety. Japanese Patent Application No. 2000-211080, filed Jul. 12, 2000, is hereby incorporated by reference in its entirety. International Application No. PCT/JP00/08397, filed Nov. 29, 2000, is hereby incorporated by reference in its entirety.

1. Field of the Invention

The present invention relates to a RAM-incorporated driver that drives the display of still and moving images on one screen, together with a display unit and electronic equipment that uses the same.

2. Description of Related Art

Recent advances in communications and packaging technologies have made it possible to display various types of highly informative data on a display section of portable electronic equipment. The data can include not only character text consisting of numerals and characters, but also more complex data, such as still and moving images.

There have been various proposals for the format that should be used in displaying data by such electronic equipment. For example, in the case of a mobile telephone, a technique has been proposed for receiving or transmitting image data that has been compressed and encoded in accordance with the Moving Picture Experts Group (MPEG) standard.

As shown, for example in FIG. 3, in such a case, received moving images are displayed on a moving-image display area 22A of a liquid crystal panel 22. Still images giving explanatory or operating information relating to those moving images are displayed on a still-image display area 22B of the liquid crystal panel 22, by way of example.

To display a moving image in the moving-image display area 22A, it is necessary to rewrite moving-image data in a moving-image storage area corresponding to the moving-image display area 22A, which is part of the storage area of a RAM within the liquid crystal driver. Of course, the moving-image data must be rewritten periodically and also substantially in real-time.

The still images displayed in the still-image display area 22B change in accordance with factors such as the operation of the keys of the mobile telephone, making it necessary to rewrite still-image data in a still-image storage area corresponding to the still-image display area 22B, within the storage area in a RAM. However, the rewriting of still-image data in the still-image storage area of the RAM periodically uses the bus line over which the moving-image data is being transferred, so it is only possible to use the time gap between the transfer of one screen of moving-image data and the transfer of the next screen of moving-image data therefor.

In this manner, the transfer of still-image data within the limited times between screens of moving-image data can restrict the operating time in which the MPU can supply moving-image data and still-image data to the display unit, which increases the time-related restrictions on the operation of the microprocessor unit (MPU) for controlling circuits other than those of the display unit.

SUMMARY OF THE INVENTION

The present invention provides a RAM-incorporated driver together with display unit and electronic equipment using the same which make it possible to rewrite still-image data irrespective of the timing at which moving-image data is rewritten in a RAM.

A RAM-incorporated driver in accordance with an aspect of the present invention drives a display section, based on still-image data and moving-image data. The RAM-incorporated driver includes first and second bus lines for transferring the still-image data and the moving-image data, respectively, a RAM which stores the still-image data and the moving-image data transferred through the first and second bus lines, a first control circuit which controls writing or reading with respect to the RAM of the still-image data or the moving-image data that has been transferred separately over the corresponding first or second bus line, based on a given command, and a second control circuit that is independent of the first control circuit, which controls the reading of the still-image data or the moving-image data stored in the RAM, and driving the display section.

In accordance with this aspect of the present invention, still images and moving images are transferred by separate systems over the first and second bus lines. In addition, control over the writing of still-image data or moving-image data to a RAM and control over the reading of display data from a RAM for driving the display section to display are each done independently.

It is therefore possible to rewrite still-image data in a RAM while simultaneously rewriting moving-image data, making it unnecessary to wait until the end of the writing of moving-image data before still-image data can be written. Moreover, it is possible to drive the display of display data independently of this control of the writing of still-image data and moving-image data.

In a RAM-incorporated driver in accordance with this aspect of the present invention, the RAM may comprise a first port in which the writing of the still-image data is executed via the first bus line, a second port in which the writing of the moving-image data is executed via the second bus line, and a memory cell having a third port for reading out the display data. In this manner, it becomes possible to specify moving-image data and still-image data with respect to a three-port memory cell by separate systems, and also read accumulated display data with yet another system. This makes it possible to write moving-image data and still-image data to a RAM and access display data with an extremely simple process, without being restricted by the necessity of controlling the reading.

A RAM-incorporated driver in accordance with another aspect of the present invention drives a display section, based on a command from an external MPU and still-image data and moving-image data. The RAM-incorporated driver can include a first bus line which transfers the still-image data from the external MPU, a second bus line which transfers the moving-image data from the external MPU, a RAM which stores the still-image data and the moving-image data, a first column address control circuit which specifies a column address in the RAM for writing the still-image data, and a second column address control circuit which specifies a column address in the RAM for writing the moving-image data. The RAM-incorporated driver can further include a first page address control circuit which specifies a page address in the RAM for writing the still-image data, a second page address control circuit which specifies a page address in the RAM for writing the moving-image data, an MPU-related control circuit which controls the first and second column address control circuits and the first and second page address control circuits, based on the command from the external MPU, a display address control circuit which controls reading of the still-image data and the moving-image data stored in the RAM, as display data, and a driver-related control circuit which controls the display address control circuit independently of the MPU-related control circuit.

In accordance with this aspect of the present invention, still-image and moving-image data is transferred by first and second bus lines using separate systems. Column and page addresses for writing data to a RAM are specified by separate still-image and moving-image systems.

It is therefore possible to rewrite still-image data in a RAM while simultaneously rewriting moving-image data, making it unnecessary to wait until the end of the writing of moving-image data before still-image data can be written.

A RAM-incorporated driver in accordance with this aspect of the present invention mayinclude a first pair of bit lines connected to a memory cell of the RAM, a second pair of bit lines connected to a memory cell of the RAM, a first column switch controlled by the first column address control circuit and connecting the first pair of bit lines with the first bus line, a second column switch controlled by the second column address control circuit and connecting the second pair of bit lines with the second bus line. The RAM-incorporated driver can further include a first word line which transfers a signal from the first page address control circuit to a control terminal of a first switch provided between a memory element within the memory cell and the first pair of bit lines and a second word line which transfers a signal from the second page address control circuit to a control terminal of a second switch provided between the memory element and the second pair of bit lines.

This forms a dual-port configuration in which there are different ports for still images and moving images. In other words, it is possible to write still-image data through the first bit line pair to a memory cell specified by the first column address control circuit and the first page address control circuit. Similarly, it is possible to write moving-image data through the second bit line pair to the memory cell specified by the second column address control circuit and the second page address control circuit. It is thus possible to write still-image data and moving-image data to any desired cells, without increasing the storage area in a RAM.

In the RAM-incorporated driver in accordance with this aspect of the present invention the RAM may have a first RAM which stores the still-image data that has been transferred via the first bus line and a second RAM which stores the moving-image data that has been transferred via the second bus line. In such a case, the display address control circuit may include a first display address control circuit which controls the reading of still-image data from the first RAM as display data and a second display address control circuit which controls the reading of moving-image from the second RAM as display data. In addition, in the first RAM, write addresses may be controlled by the first column address control circuit and the first page address control circuit, and, in the second RAM, write addresses may be controlled by the second column address control circuit and the second page address control circuit.

In this manner, the storage area is expanded to include a first RAM for still-image data and a second RAM for moving-image data, but it is possible to rewrite still-image data into the first RAM while simultaneously rewriting moving-image data into the second RAM. In this aspect of the present invention, the first column address control circuit may specify a read column address in the RAM, based on a signal from the MPU-related control circuit, and the first page address control circuit may specify a read page address in the RAM, based on a signal from the MPU-related control circuit.

This configuration makes it possible to take data that has been written to a RAM and then read it towards the external MPU. For example, it is possible for the MPU to perform a read/modify/write process whereby data written to a RAM is read, inverted, then written back to a RAM.

A display unit in accordance with further aspects of the present invention can include a panel having an electro-optical element driven by a plurality of first electrodes and a plurality of second electrodes, the RAM-incorporated driver, as defined above, which drives the plurality of first electrodes and a scanning driver which scans and drives the plurality of second electrodes. This display unit makes it possible to implement a mixed display of still and moving images, while reducing the load on the external MPU.

Electronic equipment in accordance with still further aspect of the present invention can include the display unit in accordance with the further aspect of the present invention, and an MPU for supplying the commands, the still-image data, and the moving-image data to the display unit.

Since this electronic equipment and this display unit reduce the load on the MPU during the mixed display of still images and moving images, it is therefore possible to increase the operating efficiency of the MPU.

Electronic equipment in accordance with yet further aspect of the present invention drives a display section to display an image, based on still-image data and moving-image data, and the electronic equipment can include the above-described RAM-incorporated driver, a device that sets a still-image area, with respect to a display area of the display section in which an image is displayed based on image data stored in a RAM of the RAM-incorporated driver, a device that writes the still-image data in a storage area of the RAM, the storage area corresponding to the still-image area, a device that sets a moving-image area with respect to the display area, and a device that writes the moving-image data into a storage area of the RAM, the storage area corresponding to the moving-image area.

Since the present invention makes it possible to write still-image data and moving-image data separately to a RAM which stores display data for driving the display of a display section, it is unnecessary to perform the writing to a RAM of still-image data and moving-image data after they have been subjected to mixing, as in the prior art. It is therefore possible to provide electronic equipment in which the process of creating display data is greatly simplified, the processing load on components such as the MPU is greatly reduced, and high-quality image processing is enabled.

Electronic equipment in accordance with yet another aspect of the present invention drives a display section to display an image, based on still-image data and moving-image data, and the electronic equipment can include the above-described RAM-incorporated driver a device that sets a still-image area, with respect to a display area of the display section in which an image is displayed based on image data stored in a RAM of the RAM-incorporated driver, a device that writes the still-image data in a storage area of the RAM, the storage corresponding to the still-image area, a device that sets an arbitrary moving-image area with respect to the still-image area, a device that writes the moving-image data into a storage area of the RAM, the storage area corresponding to the moving-image area.

The present invention makes it possible to write new display data sequentially, regardless of the setting state in the display section of a still-image area in which a still image is displayed and a moving-image area in which a moving image is displayed. By enabling the display of a moving image in the display section by writing moving-image data as an overwrite of temporarily written still-image data, thus greatly reducing the amount of complicated display processing wherein still and moving images are mixed.

BRIEF DESCRIPTION OF THE DRAWINGS

The preferred embodiments of this invention will be described with reference to the following figures, wherein like reference numerals/reference like elements, and wherein.

DETAILED DESCRIPTION OF PREFERRED EMBODIMENTS

Figure 1:
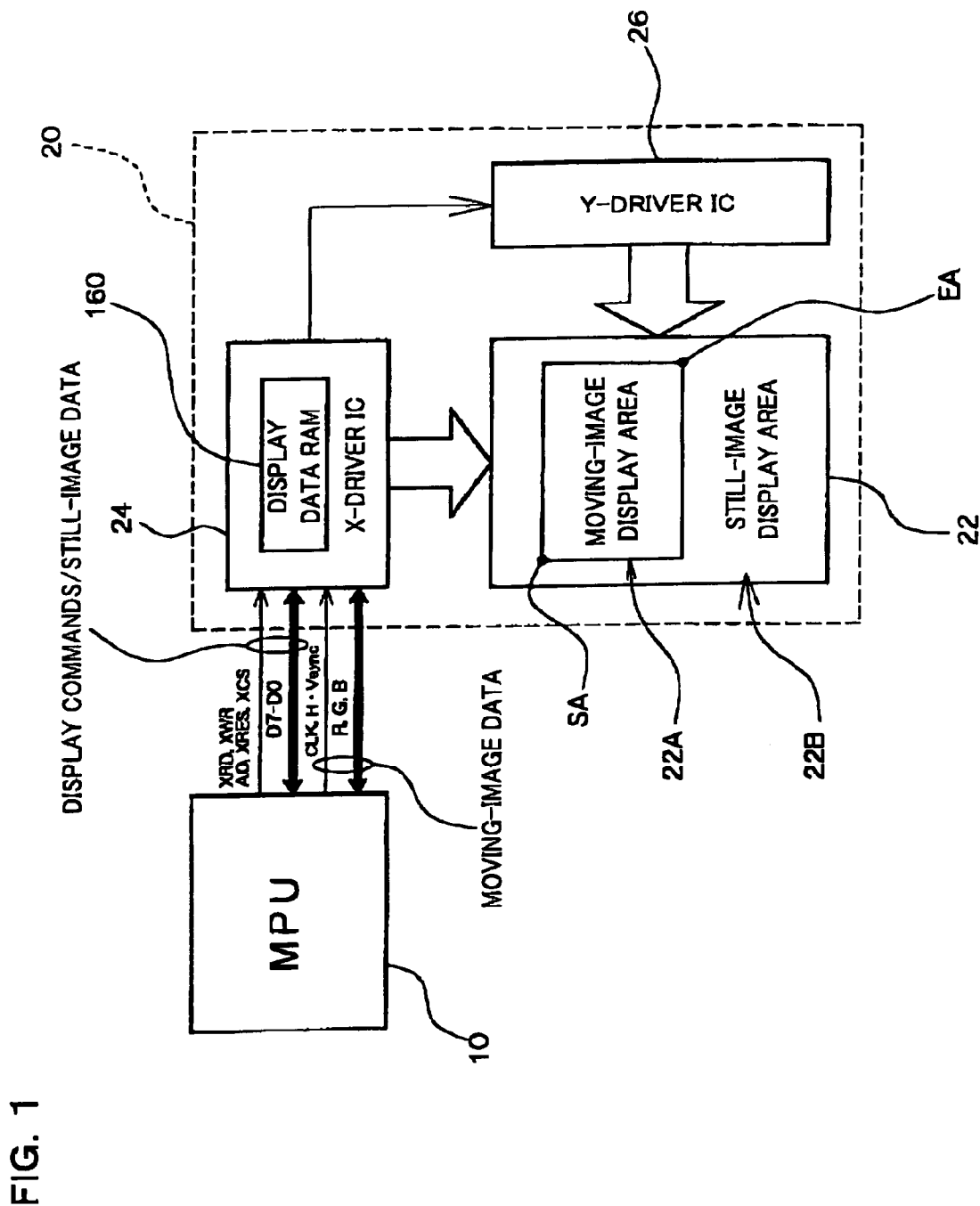
FIG. 1 is a schematic block diagram of electronic equipment to which the present invention is applied.

A first embodiment of the present invention is described below with reference to FIGS. 1 to 7. FIG. 1 shows a schematic block diagram of electronic equipment to which the present invention is applied. In FIG. 1, the electronic equipment is configured of a microprocessor unit (MPU) 10 and a display unit 20. The display unit 20 has a matrix panel having electro-optical elements, such as a color liquid crystal panel 22, a RAM-incorporated X-driver IC 24 for driving this liquid crystal panel 22, and a Y-driver IC 26 for scanning.

The matrix panel 22 could be one that uses a liquid crystal having optical characteristics that change on the application of a voltage, and other electro-optical elements. For example, the liquid crystal panel 22 could be configured of a simple matrix panel in which a liquid crystal is sealed between a first substrate on which is formed a plurality of segment electrodes (first electrodes) and a second substrate on which is formed a common electrode (second electrode). The liquid crystal panel 22 could also be configured of an active matrix panel using three-terminal elements or two-terminal elements such as thin-film transistors (TFTs) or thin-film diodes (TFDs). Such an active matrix panel would also have a plurality of signal electrodes (first electrodes) driven by the RAM-incorporated X-driver IC 24 and a plurality of scan electrodes (second electrodes) driven to scan by the Y-driver IC 26.

It is possible to display still images and moving images simultaneously on the liquid crystal panel 22. In such a case, areas for a moving-image display area 22A, determined by the image size of moving-image data stored in the MPU 10, and a still-image display area (text data display area) 22B, outside thereof, are set in the liquid crystal panel 22.

Two main types of data are supplied from the MPU 10 to the display unit 20, as shown in FIG. 1: display command/still-image data and moving-image data. Representative examples of display commands include a signal A0 that indicates the difference between commands and data, an inverted reset signal XRES, an inverted chip select signal XCS, an inverted read signal XRD, and an inverted write signal XWR. Data signals D7 to D0 are 8-bit command data (including address data for still images and moving images) or still-image data signals, as distinguished by the logic of the command/data identification signal A0. The moving-image data is 6-bit R, G, and B signals, and a clock signal CLK and horizontal/vertical synchronization signal H.Vsync are also supplied.

Thus a bus for display command/still-image data and a bus for moving-image data are separated in this embodiment of the present invention.

Figure 2:
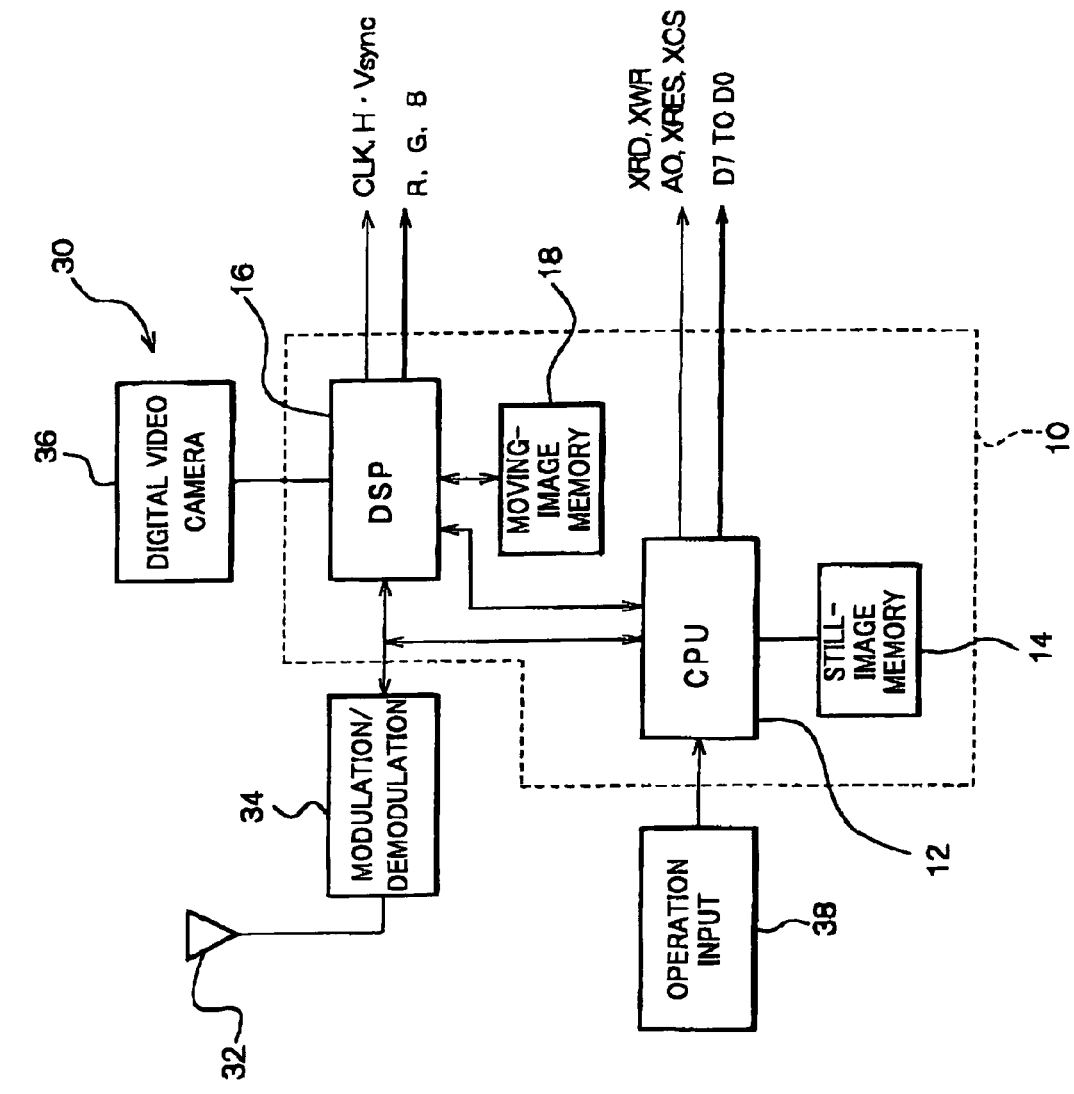
FIG. 2 is a schematic block diagram of a mobile telephone that is an example of the electronic equipment of FIG. 1.

In an example shown in FIG. 2, the MPU 10 and display unit 20 of FIG. 1 are installed into a mobile telephone 30. The MPU 10 shown in FIG. 2 has a CPU 12 for controlling the mobile telephone 30, and a still-image memory 14 and a digital signal processor (DSP) 16 are connected to this CPU 12. A moving-image memory 18 is also connected to the DSP 16.

A modulation/demodulation circuit 34 is also provided in the mobile telephone 30, for demodulating signals received through an antenna 32 and modulating signals to be transmitted by the antenna 32. It is also possible to use the antenna 32 to transmit and receive moving-image data that has been encoded in accordance with the layer-IV standard of the Moving Picture Experts Group (MPEG).

A digital video camera 36 can also be provided in this mobile telephone 30. Moving-image data can be captured through this digital video camera 36. The information necessary for operations such as transmission and reception by the mobile telephone 30 or image captured by the digital video camera 36 is input through an operation input section 38.

Figure 3:
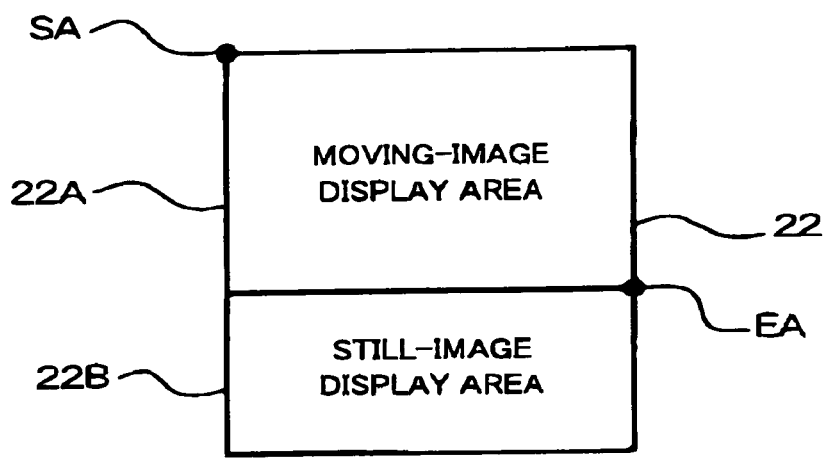
FIG. 3 is a schematic illustrative diagram of an example of display that differs from the display example of the liquid crystal panel shown in FIG. 1.

When a moving image is displayed in the moving-image display area 22A of the liquid crystal panel 22, the CPU 12 provided in the MPU 10 determines the dimensions of that moving image from moving-image information. In other words, the MPU 10 determines a start address SA and an end address EA of the moving image shown in FIG. 1. It is to be understood that the moving-image display area 22A and the still-image display area 22B could be divided vertically by a line, as shown in FIG. 3. In this case, the start address SA and the end address EA are determined from the size of the moving image in a similar manner.

The moving image displayed in the moving-image display area 22A is supplied from the antenna 32 or the digital video camera 36 in this embodiment of the invention. Signals input from the antenna 32 are demodulated through the modulation/demodulation circuit 34 and are processed by the DSP 16. The moving-image processing memory 18 is connected to the DSP 16. The DSP 16 can expand compressed data that is input through the antenna 32 and the modulation/demodulation circuit 34 and also decodes data that has been encoded in accordance with the MPEG layer IV standard. Data that is to be transmitted through the modulation/demodulation circuit 34 and the antenna 32 is compressed by the DSP 16, and also encoded if it is to be transmitted in a format in accordance with the MPEG layer IV standard. In this manner, the DSP 16 can also have the function of a decoder and encoder for MPEG layer IV data, by way of example.

Signals from the digital video camera 36 are input to the DSP 16, and signals that have been input by the antenna 32 or the digital video camera 36 are processed by the DSP 16 into RGB signals and are supplied to the display unit 20.

The CPU 12 outputs to the display unit 20 the commands and data necessary for displaying a still image on the liquid crystal panel 22, based on information from the operation input section 38 and using the still-image memory 14 if necessary.

For example, it is therefore possible to implement ticket reservations based on information from the operation input section 38, wherein moving images are movie information that is distributed over the Internet and information for reserving theater tickets is displayed as still images. For that purpose, the CPU 12 also controls the sending out of still-image information (such as reservation information) through the modulation/demodulation circuit 34 and the antenna 32. The CPU 12 can also control the sending out of moving-image information captured by the digital video camera 36 over the modulation/demodulation circuit 34 and the antenna 32, if necessary.

Figure 4:
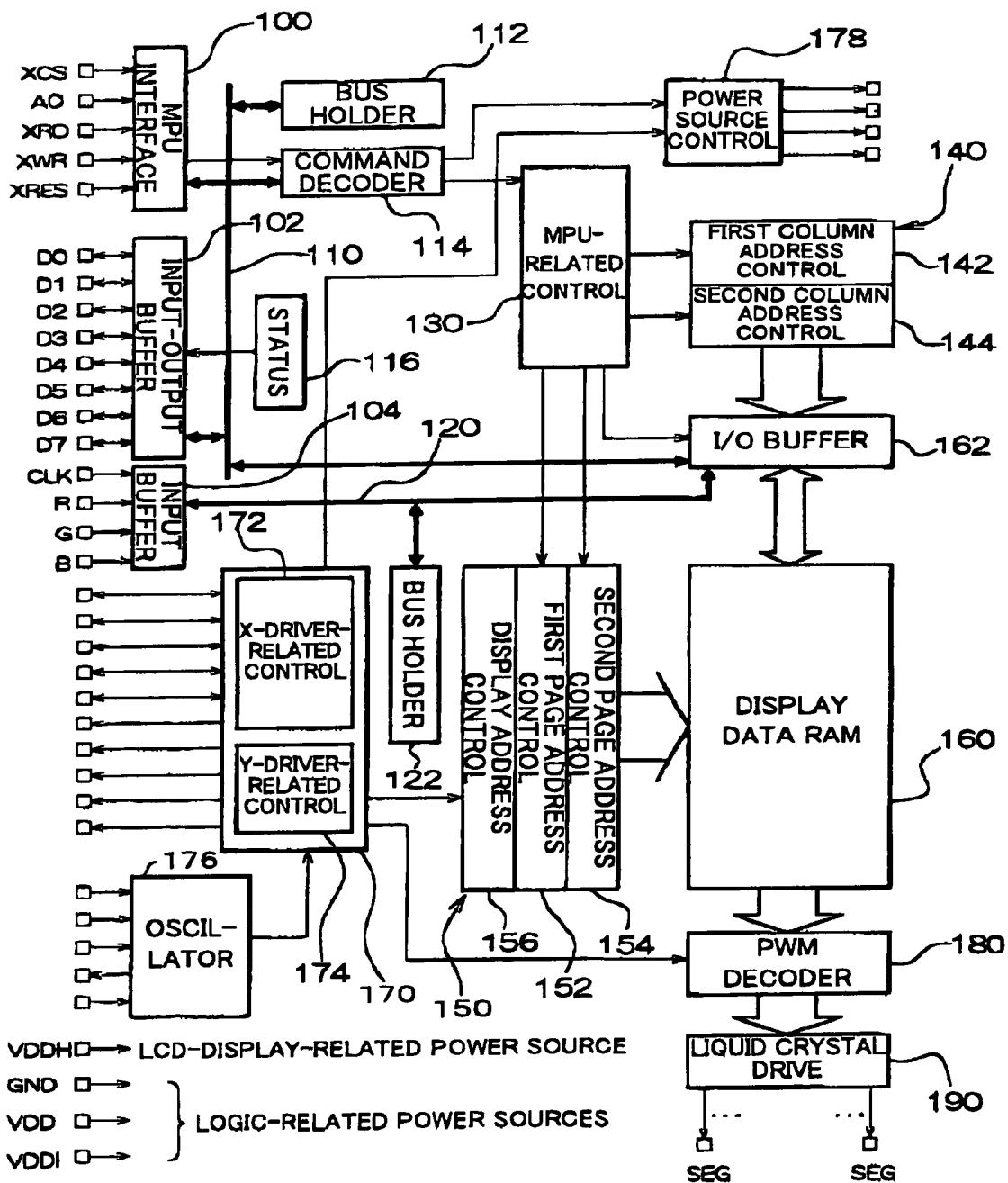
FIG. 4 is a schematic block diagram of the X-driver IC of FIG. 1.

FIG. 4 shows an exemplary block diagram of the RAM-incorporated X-driver IC 24. An MPU interface 100, an input-output buffer 102, and an input buffer 104 are provided as input-output circuitry for the RAM-incorporated X-driver IC 24 of FIG. 4. Signals such as the inverted chip select signal XCS, the command/data identification signal A0, the inverted read signal XRD, the inverted write signal XWR, and the inverted reset signal XRES are input to the MPU interface 100.

Data such as 8-bit command or still-image data D7 to D0 is input to the input-output buffer 102. Note that FIG. 4 shows an example in which the signals D7 to D0 are input and output in parallel, but it is also possible to use a serial input-output configuration in which the first bit is the identification signal A0, followed by the signals D7 to D0, if it is not necessary to read data to the MPU 10 from a display data RAM 160 within the X-driver IC 24. This would make it possible to reduce the number of terminals of the MPU 10 and the X-driver IC 24.

Data such as moving-image data formed of 6-bit R, G, and B signals and the clock signal CLK is input to the input buffer 104, by way of example. The clock signal 6-bit R, G, and B signals are input and output in parallel, in synchronization with the clock signal CLK.

The interior of the X-driver IC 24 is provided with a first bus line 110 connected to the MPU interface 100 and the input-output buffer 102 and a second bus line 120 connected to the input buffer 104.

A bus holder 112 and a command decoder 114 are connected to the first bus line 110 and another bus holder 122 is connected to the second bus line 120. Note that a status setting circuit 116 is connected to the input-output buffer 102 in such a manner that the operating state of the X-driver IC 24 is output to the MPU 10. This operating state is an internal state set by the X-driver IC 24, such as whether or not the display is in an on state and a given scroll area within the screen has been set to scroll mode, with the configuration being such that a given command that has been input from the MPU 10 is decoded by the command decoder 114 which outputs the result thereof.

An I/O buffer 162 of the display data RAM 160 is connected to both the first and second bus lines 110 and 120, for the transfer of still-image data and moving-image data that is read from and written to the display data RAM 160.

In addition to the above described display data RAM 160 and I/O buffer 162, circuits such as an MPU-related control circuit 130, a column address control circuit 140, a page address control circuit 150, a driver-related control circuit 170, a PWM decoder circuit 180, and a liquid crystal drive circuit 190 are provided in the X-driver IC 24.

The MPU-related control circuit 130 controls reading and writing with respect to the display data RAM 160, based on commands from the MPU 10 that are input through the command decoder 114. The column address control circuit 140 and the page address control circuit 150 are controlled by this MPU-related control circuit 130. In this embodiment, the column address control circuit 140 has a first column address control circuit 142, which specifies write column addresses for still-image data and read column addresses for still-image and moving-image data, and a second column address control circuit 144, which specifies write column addresses for moving-image data. The page address control circuit 150 has a first page address control circuit 152, which specifies write page addresses for still-image data and read page addresses for still-image and moving-image data, and a second page address control circuit 154, which specifies write page addresses for moving-image data. Note that the horizontal/vertical synchronization signal H.Vsync is input from the MPU 10 to the MPU-related control circuit 130, although this is not shown in FIG. 4.

A horizontal synchronization signal Hsync is used for setting and resetting counters that are provided within the second column and page addresses control circuits 144 and 154, to suppress errors such as display distortion due to erroneous writing caused by noise or the like during the writing of moving-image data, as far as possible. The horizontal/vertical synchronization signal H.Vsync is also used for returning each of the column and page addressees to the respective start address SA. The page address control circuit 150 comprises a display address control circuit 156 which specifies display addresses for each line controlled by the driver-related control circuit 170.

The driver-related control circuit 170 can include an X-driver-related control circuit 172 and a Y-driver-related control circuit 174. This driver-related control circuit 170 generates signals such as a color gradation control pulse GCP, a polarity inversion signal FR, and a latch pulse LP, to control the display address control circuit 156, the PWM decoder circuit 180, a power source control circuit 178, and the Y-driver IC 26, independently of the MPU-related control circuit 130.

The PWM decoder circuit 180 latches data that is read one line at a time from the display data RAM 160, and outputs a signal of a pulse width corresponding to color gradation value in accordance with the polarity inversion period. The liquid crystal drive circuit 190 shifts the voltage of a signal from the PWM decoder circuit 180 and supplies the voltage to each segment electrode SEG of the liquid crystal panel 22 of FIG. 1.

Figure 5:
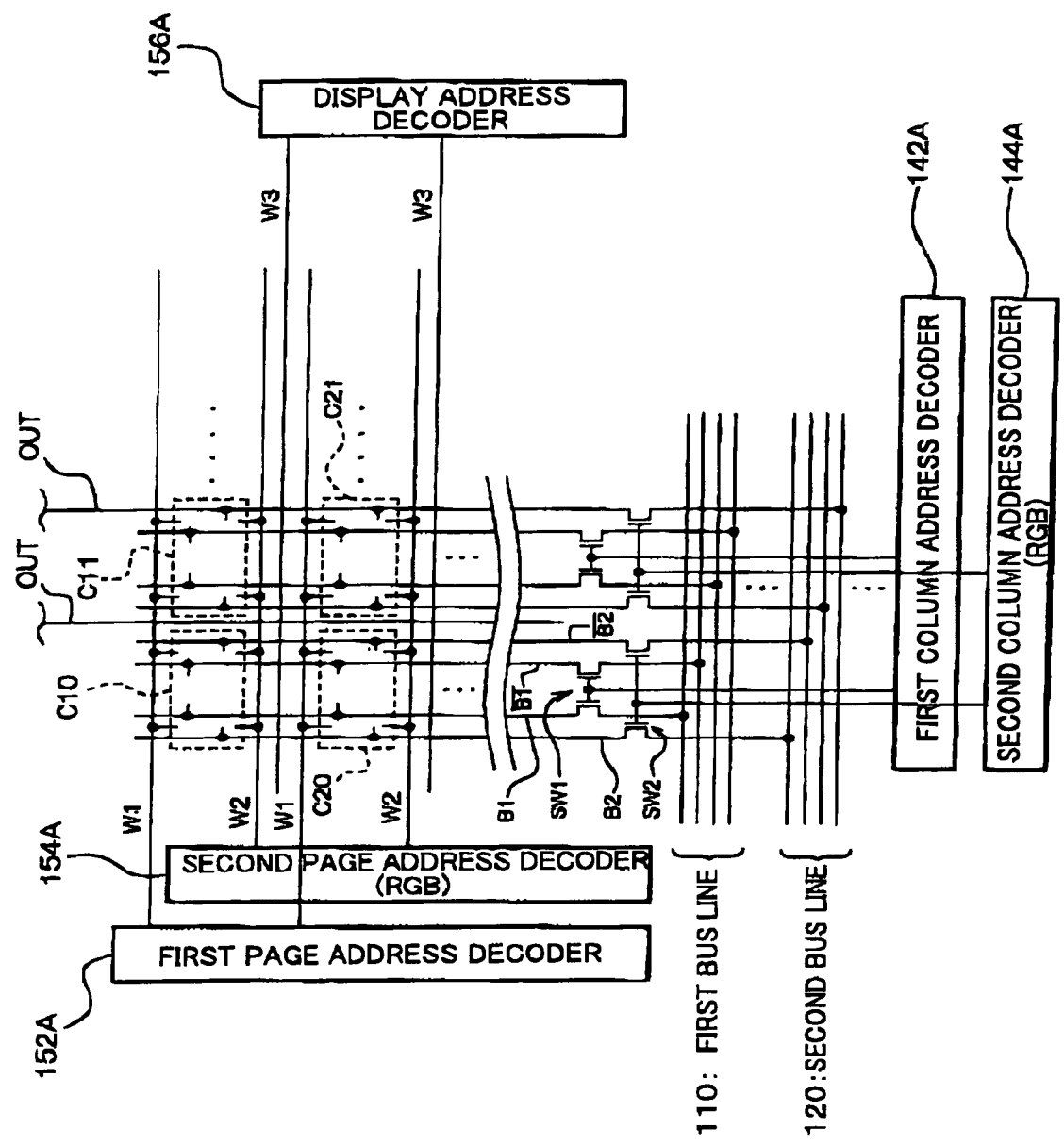
FIG. 5 is a schematic illustrative diagram of the display data RAM of FIG. 4, together with peripheral circuits.

FIG. 5 shows an exemplary schematic circuit diagram of the display data RAM 160 and its peripheral circuits. FIG. 5 shows first and second column address decoders 142A and 144A, first and second page address decoders 152A and 154A, and a display address decoder 156A that are provided in final stages of the first and second column address control circuits 142 and 144, the first and second page address control circuits 152 and 154, and the display address control circuit 156, respectively.

FIG. 5 also shows memory cells C10, C11, . . . , C20, C21, . . . of first and second rows. Each memory cell shown in FIG. 5 is connected to first to third word lines W1 to W3, a first bit line pair B1 and $\overline{B1}$, and a second bit line pair B2 and $\overline{B2}$.

The first column address decoder 142A outputs a signal that turns on and off a first column switch SW1 that is connected to the first bit line pair B1 and $\overline{B1}$. The second column address decoder 144A outputs a signal that turns on and off a second column switch SW2 that is connected to the second bit line pair B2 and $\overline{B2}$. The first page address decoder 152A supplies a signal that makes the first word line W1 active, the second page address decoder 154A supplies a signal that makes the second word line W2 active, and the display address decoder 156A supplies a signal that makes the third word line W3 active.

In comparison with the prior-art technique, this embodiment of the present invention is newly provided with the second word line W2, the second bit line pair B2 and $\overline{B2}$, the second column switch SW2, the second column address decoder 144A, and the second page address decoder 154A.

The second column and page addresses decoders 144A and 154A are used only when specifying column and page addressees for writing moving-image data (R, G, B), and this moving-image data (R, G, B) is written to memory cells through the second bus line 120 and the second column switch SW2 in accordance with this specification.

The first column and page addresses decoders 142A and 152A specify column and page addresses during the writing of still-image data and the reading of still-image and moving-image data. Data is read from or written to the display data RAM 160 through the first bus line 110 and the first column switch SW1 in accordance with this address specification.

The display address decoder 156A is designed to read data from all the memory cells on one line to a display data output line OUT, by making the third word line W3 active one line at a time in sequence. This read data is supplied to the PWM decoder circuit 180 of FIG. 4 and is supplied to the liquid crystal drive.

Figure 6:
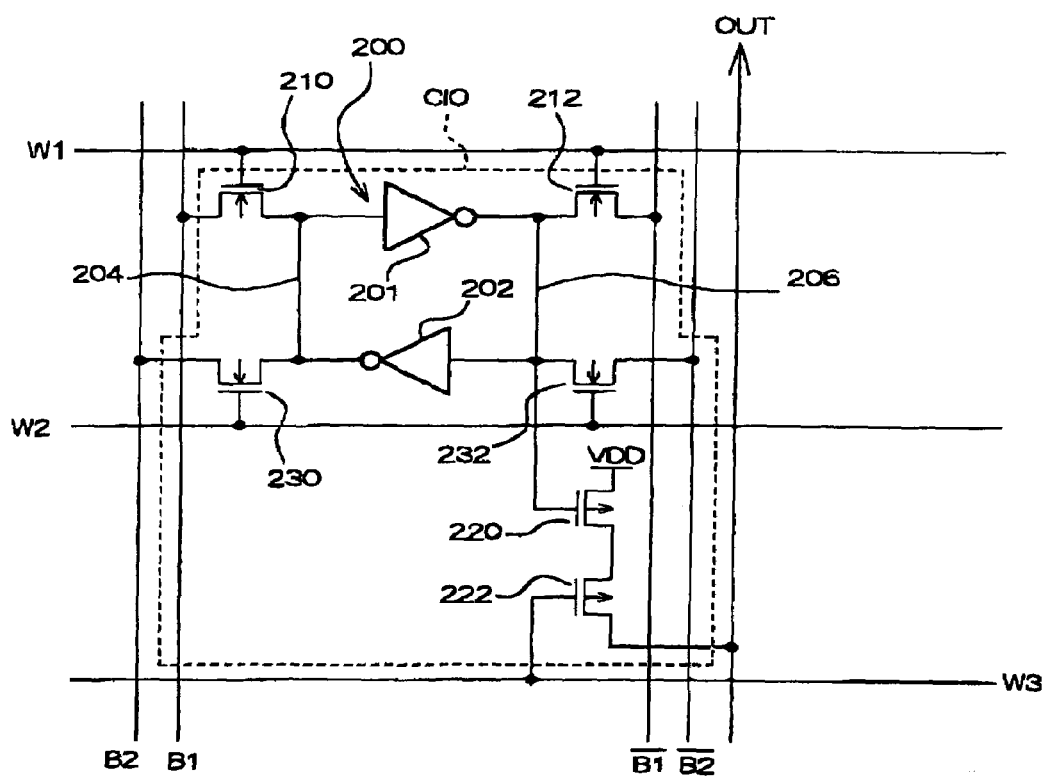
FIG. 6 is a circuit diagram of memory cells within the display data RAM of FIG. 5.

FIG. 6 shows an exemplary circuit diagram of the memory cell C10 within the display data RAM 160. The memory cell C10 has the same configuration as the other memory cells. This memory cell C10 has a memory element 200 formed of two CMOS inverters 201 and 202. The two MOS inverters 201 and 202 have first and second wires 204 and 206 that connect together the input and output sides thereof, respectively. A first n-type MOS transistor 210 (first switch) is connected between the first wire 204 and the bit line B1, with the gate thereof being connected to the first word line W1. Similarly a second n-type MOS transistor 212 (first switch) is connected between the second wire 206 and the bit line $\overline{B1}$, with the gate thereof being connected to the first word line W1.

The above described configuration ensures that the first and second n-type transistors 210 and 212 are turned on when the first word line W1 goes high in answer to an active signal from the first page address decoder 152A. This connects the memory cell C10 to the first pair of bit lines B1 and $\overline{B1}$. If the first column switch SW1 is turned on by an active signal from the first column address decoder 142A during this time, it becomes possible to read or write data with respect to the memory cell C10.

The first and second p-type MOS transistors 220 and 222 are connected between a power line VDD and the display data output line OUT. The gate of the first p-type MOS transistor 220 is connected to the second wire 206 and the gate of the second p-type MOS transistor 222 is connected to the third word line W3.

Before data is read out of the memory cell C10 to the display data output line OUT, the display data output line OUT is pre-charged to low. In a state in which the third word line W3 is low and the second p-type MOS transistor 222 is on, after this pre-charge operation, the data on the display data output line OUT is latched into the PWM decoder circuit 180. During this time, if the potential of the second wire 206 is high (the potential of the first wire 204 is low), the display data output line OUT remains low, but if the potential of the second wire 206 is low (the potential of the first wire 204 is high), the display data output line OUT goes high. This makes it possible to read one line of display data from the display data RAM 160 simultaneously.

A further feature of this embodiment of the present invention lies in the way the second word line W2 and the second bit line pair B2 and $\overline{B2}$ are connected. To ensure that connection, a third n-type MOS transistor 230 (second switch) is connected between the first wire 204 and the bit line B2, with the gate thereof being connected to the second word line W2. Similarly, a fourth n-type MOS transistor 232 (second switch) is connected between the second wire 206 and the bit line $\overline{B2}$, with the gate thereof being connected to the second word line W2.

The above described configuration ensures that the third and fourth n-type transistors 230 and 232 turn on so that the memory cell C10 is connected to the second pair of bit lines B2 and $\overline{B2}$, if the second word line W2 goes high in answer to an active signal from the second page address decoder 154A. If the second column switch SW2 is turned on by an active signal from the second column address decoder 144A during this time, it becomes possible to write moving-image data with respect to the memory cell C10.

The MPU 10 has previously obtained the page and column addresses of the display data RAM 160 corresponding to the start and end addresses SA and EA of the moving-image display area 22A, from moving-image information. For that reason, it is possible for the MPU 10 to repeatedly specify column and page addresses for an area corresponding to the moving-image display area 22A, from areas within the display data RAM 160, in accordance with a predetermined write frequency. The column and page addresses of this area corresponding to the moving-image display area 22A are input to the second column address control circuit 144 and the second page address control circuit 154 through the input-output buffer 102 and the MPU-related control circuit 130 of the X-driver IC 24. The column and page addresses of the display data RAM 160 are ultimately specified through the second column address decoder 144A and the second page address decoder 154A of FIG. 5. By transferring moving-image data through the input buffer 104 and the second bus line 120, the transfer can be done in real-time over a path that differs from that of the still-image data over the first bus line 110, so that the moving-image data can be rewritten in real-time.

The MPU 10 specifies the column address and page address of an area within the display data RAM 160 corresponding to the still-image display area 22B, so that data rewrite is performed at a predetermined write frequency only when there are changes in the still-image data, such as when information is input from the operation input section 38.

In this manner, this configuration of this embodiment of the present invention implements address specification and data transfer by separate routes for still images and moving images written to the display data RAM 160, so that each set of data can be written to memory cells. It is therefore possible to write a still image and a moving image simultaneously to different memory cells in page units, so there is no necessity to halt the writing of either type of data.

Since the configuration is such that either a still image or a moving image can be written to memory cells, it is possible to modify the moving-image display area 22A as desired.

Figure 7:
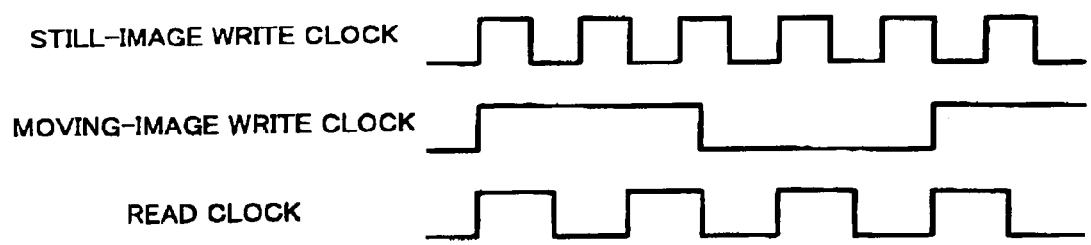
FIG. 7 is a waveform chart of a write clock for still and moving images and a display read clock.

When a moving image is to be displayed in the moving-image display area 22A of the liquid crystal panel 22 in this case, display data is read from the display data RAM 160 in accordance with a read clock shown in FIG. 7, to enable display at a rate of 60 Hz, in other words, 60 frames per second, by way of example.

For still-image data, on the other hand, display data is written to the display data RAM 160 in accordance with a still-image write clock that enables display at a frequency that is higher than that for driving the liquid crystal display, such as 90 Hz or 90 frames per second. Since this enables the implementation of rewriting of still images at a write rate that is faster than the display read rate, it becomes possible to provide a display that adapts to factors such as scroll display in accordance with the operation of the operation input section 38.

In contrast thereto, moving-image data makes use of the persistence-of-vision effect on human retinas, so there is no problem even when the number of frames in the moving image is low (it is not necessary to rewrite the entire 60 frames for the display), in cases where it is not required to have an accurate moving-image display, such as on a mobile telephone. With this embodiment, writing can be done at a frequency that enables the writing of moving-image data at a rate such as 20 Hz, or 20 frames per second, so it suffices to send out ⅓ (20/60 for a frequency of 60 frames) of the data from the MPU 10 to the X-driver IC 24. If an X-driver IC without internal RAM were to be used, it would always be necessary to rewrite data for 60 frames, but such a lowering of the write frequency of moving images (lowering of the write rate), or the quantity of data to be rewritten, reduces the number of times that moving-image data is written, where that would usually necessitate rewriting of the contents of the display data RAM 160 (unlike with still images), and thus the power consumed can be reduced by an amount equivalent to that number of memory cells.

Figure 8:
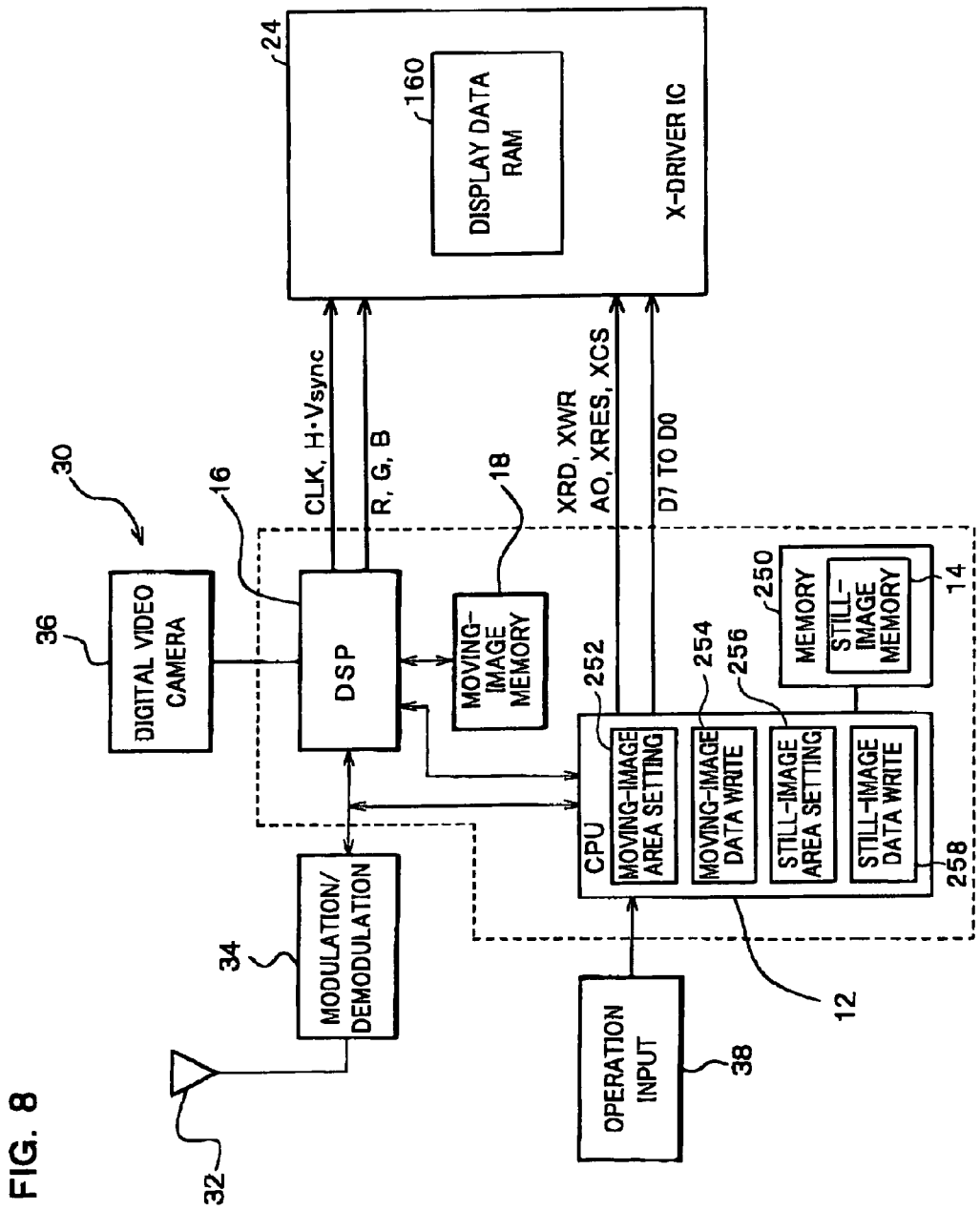
FIG. 8 is a block diagram of essential structural components of an example of a mobile telephone that is electronic equipment provided with the X-driver IC of the first embodiment of the present invention.

The description now turns to electronic equipment that is provided with the X-driver IC 24 of the above described first embodiment of the present invention. A block diagram in FIG. 8 shows exemplary structural components of an example of a mobile telephone that is electronic equipment provided with the X-driver IC 24 in accordance with the first embodiment. Note that circuits in FIG. 8 that have the same functions as circuits in FIG. 2 are denoted by the same reference numbers and further description thereof is omitted.

The CPU 12 of the first embodiment is connected to a memory 250. The memory 250 comprises a program memory, in which is stored a program to be executed by the CPU 12, and the still-image memory 14. The CPU 12 transfers still-image data or moving-image data with respect to the X-driver IC 24, for displaying still images and moving images on the liquid crystal panel 22, in accordance with the program stored in this program memory. In other words, the CPU 12 transfers still-image data for the display of still images on the liquid crystal panel 22 with respect to the X-driver IC 24, and also instructs the DSP 16 to create and transfer moving-image data for the display of moving images on the liquid crystal panel 22. The configuration is therefore such that still-image data and moving-image data are transferred with respect to the X-driver IC 24 by different systems.

For that reason, the CPU 12 can include at least a moving-image area setting section 252, a moving-image data write section 254, a still-image area setting section 256, and a still-image data write section 258.

The moving-image area setting section 252 sets a moving-image area that is specified by the start address SA and the end address EA at any position within the display area in which images are displayed on the liquid crystal panel 22, based on display data stored in the display data RAM 160 of the X-driver IC 24. If each pixel in the matrix-form display area of the liquid crystal panel 22 has been defined by an address, this moving-image area can be assumed to be a rectangular area specified by a diagonal line joining the start address SA and the end address EA.

The moving-image data write section 254 performs write instructions with respect to the DSP 16, for moving-image data to the moving-image area set by the moving-image area setting section 252. The DSP 16 transfers to the X-driver IC 24 the moving-image data stored in the moving-image memory 18 that has been created in order to display moving-image information in the moving-image area that has been set by the moving-image area setting section 252 of the CPU 12, and writes the data to the storage area in the display data RAM 160 corresponding to the thus-set moving-image area.

The still-image area setting section 256 sets a still-image area at any position within the display area in which images are displayed on the liquid crystal panel 22, based on the display data stored in the display data RAM 160 of the X-driver IC 24. This still-image area is specified by a different start address SA' and end address EA', in a similar manner to the moving-image area. This still-image area could also be a rectangular area specified by a diagonal line joining the start address SA' and the end address EA', if each pixel disposed in the matrix-form display area of the liquid crystal panel 22 has been defined by an address.

The still-image data write section 258 writes still-image data to the still-image area that has been set by the still-image area setting section 256. More specifically, the CPU 12 transfers to the X-driver IC 24 still-image data stored in the still-image memory 14 that has been created in order to display still-image information such as text in the still-image area that has been set by the still-image area setting section 256, and writes it to the storage area in the display data RAM 160 corresponding to the thus-set still-image area.

It is to be understood that the above described functions of the CPU 12 could be implemented completely by hardware or completely by programming. Alternatively, they could be implemented by a combination both hardware and programming.

Figure 9:
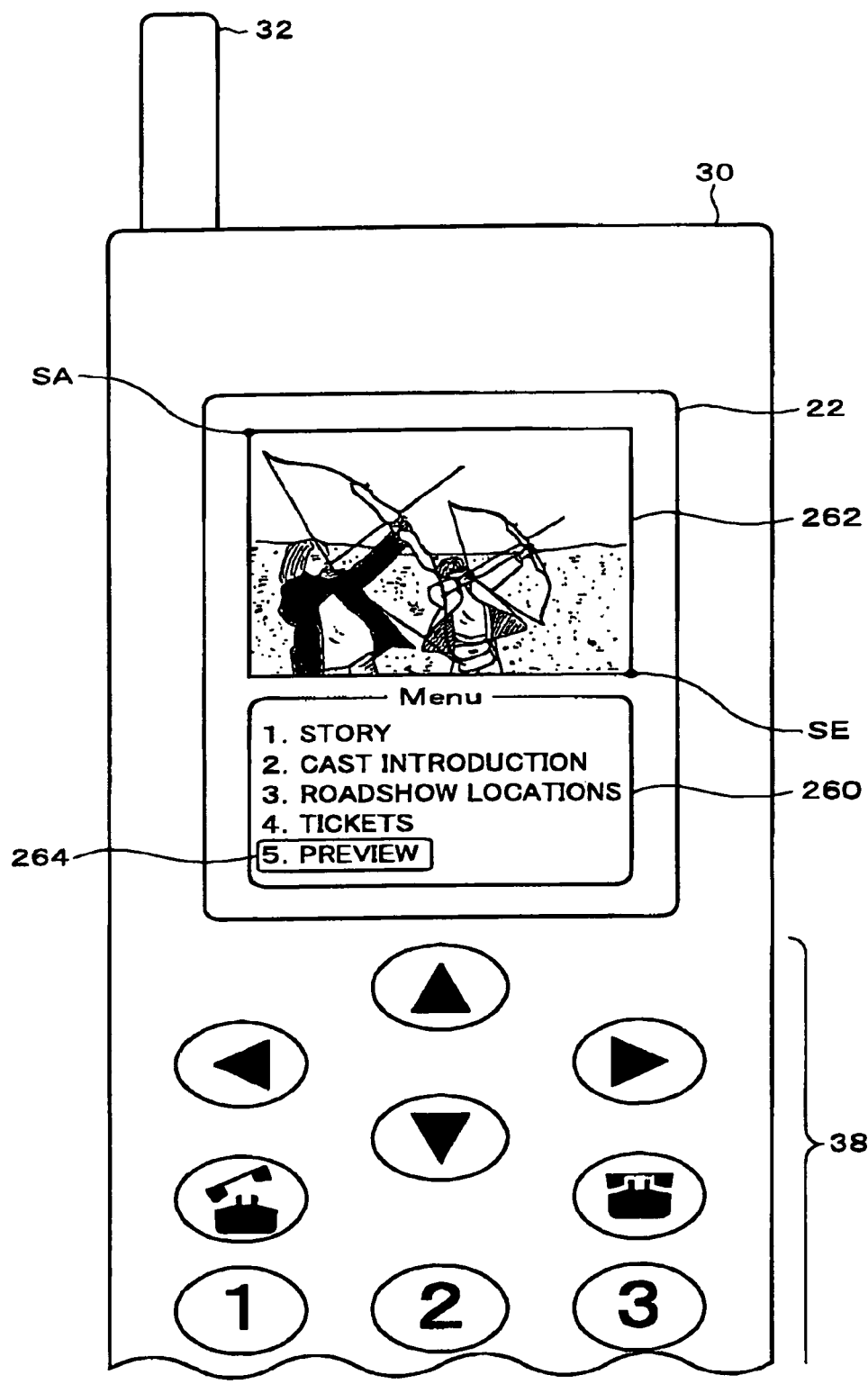
FIG. 9 is an illustrative diagram of an example of the display section of the mobile telephone provided with the X-driver IC of the first embodiment of the present invention.

An example shown in FIG. 9 is of a display section of the mobile telephone that is electronic equipment in which these functions of the CPU 12 have been implemented. This illustrates an example in which the user of the mobile telephone 30 accesses a content server on the Internet, to display contents that provide movie information.

The user operates keys as the operation input section 38 in order to receive contents data by accessing a given contents server over the Internet. This contents data is a mix of moving images and still images, with corresponding image sizes comprises within moving-image information and still-image information, respectively. If there is no information relating to image sizes in the moving-image information and still-image information, the assumed image size for the display can be assumed to be the entire display area of the liquid crystal panel 22.

The mobile telephone 30 in accordance with the first embodiment is configured to detect image sizes from the moving-image information or still-image information that is comprised within the received contents data, then set the corresponding moving-image display area or still-image (or text) display area. The example shown in FIG. 9 is a case in which the lower portion of the display area of the liquid crystal panel 22 that is the display section of the mobile telephone 30 is set to be a still-image display area 260 and an upper portion thereof is set to be a moving-image display area 262.

A menu screen enabling the selection of various services provided by the accessed contents server is displayed in the still-image display area 260. The user receives the provision of a service corresponding to a selected item, by operating the keys of the operation input section 38 to cause a cursor 264 to move, thereby selecting a desired item.

With electronic equipment in accordance with the first embodiment, the configuration is such that images corresponding to the items of the menu screen that is displayed in the still-image display area 260 are displayed at given positions of the liquid crystal panel 22.

For example, if the user has selected "1. Story", story information of the movie, consisting of text characters, is fetched from the contents server and is displayed at a given position on the liquid crystal panel 22. Similarly, if the user has selected "4. Tickets", information for reservations of theater tickets for that movie is displayed as a still image in the given still-image area of the liquid crystal panel 22, and the configuration is such that ticket reservation can be based on information from the operation input section 38. The dimensions and display area of this still-image display area depend on the still-image information to be displayed. If the user has selected "5. Preview", furthermore, preview information on the movie is fetched as moving-image data from the contents server, and a moving image is displayed in the moving-image display area 262. The dimensions and display area of this moving-image display area 262 depend on the moving-image information to be displayed.

In addition, electronic equipment in accordance with the first embodiment could become a novel publicity advertisement medium such that, if the user does not select a menu screen by operating the keys, moving images with the objective of publicity advertisements from the contents server are displayed in succession at a given position of the liquid crystal panel 22.

Figure 10:
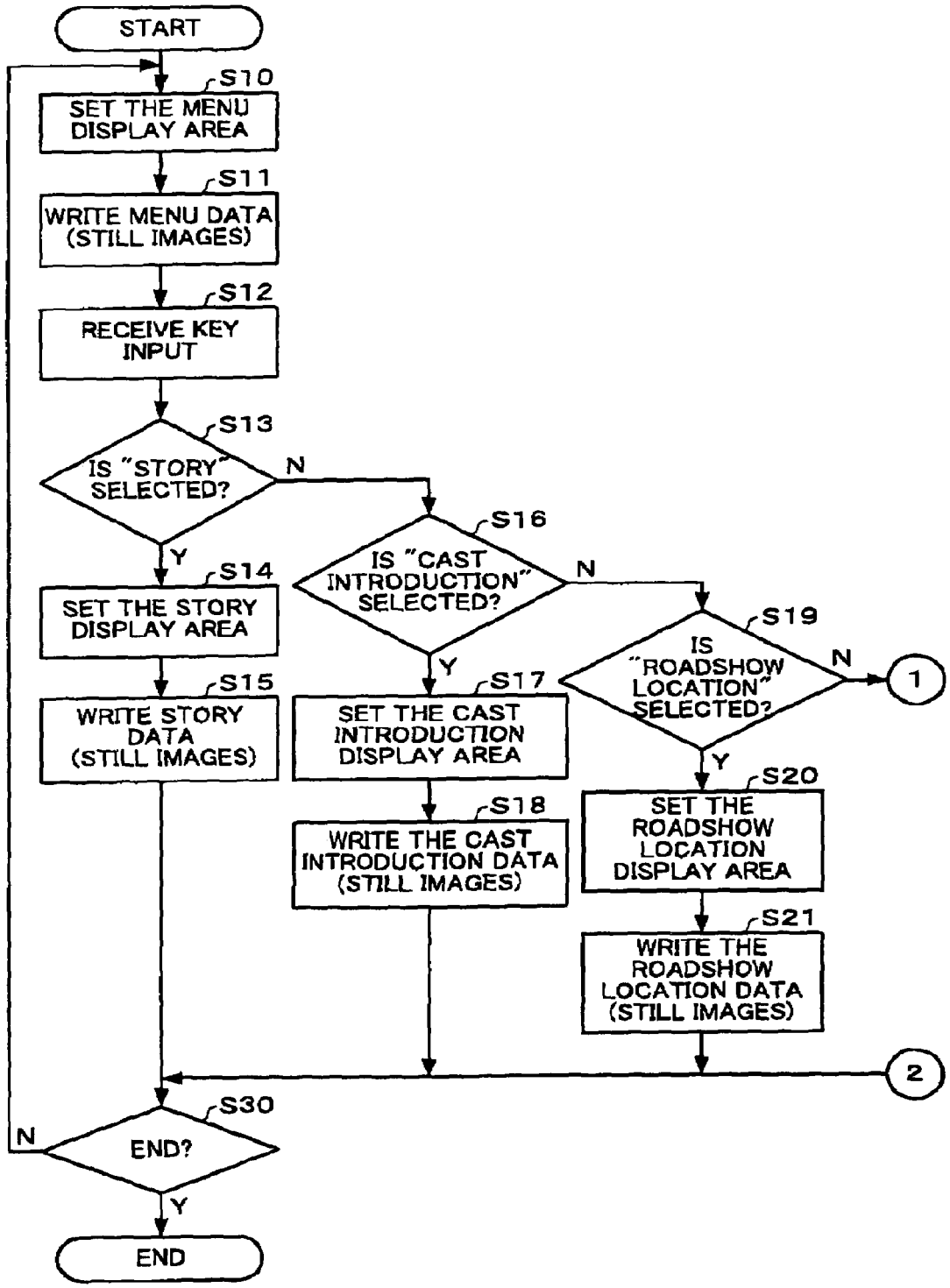
FIG. 10 is a flow chart illustrating the first half of an example of display processing of image information that is a mixture of still images and moving images, in the mobile telephone that is electronic equipment in accordance with the first embodiment of the present invention.
Figure 11:
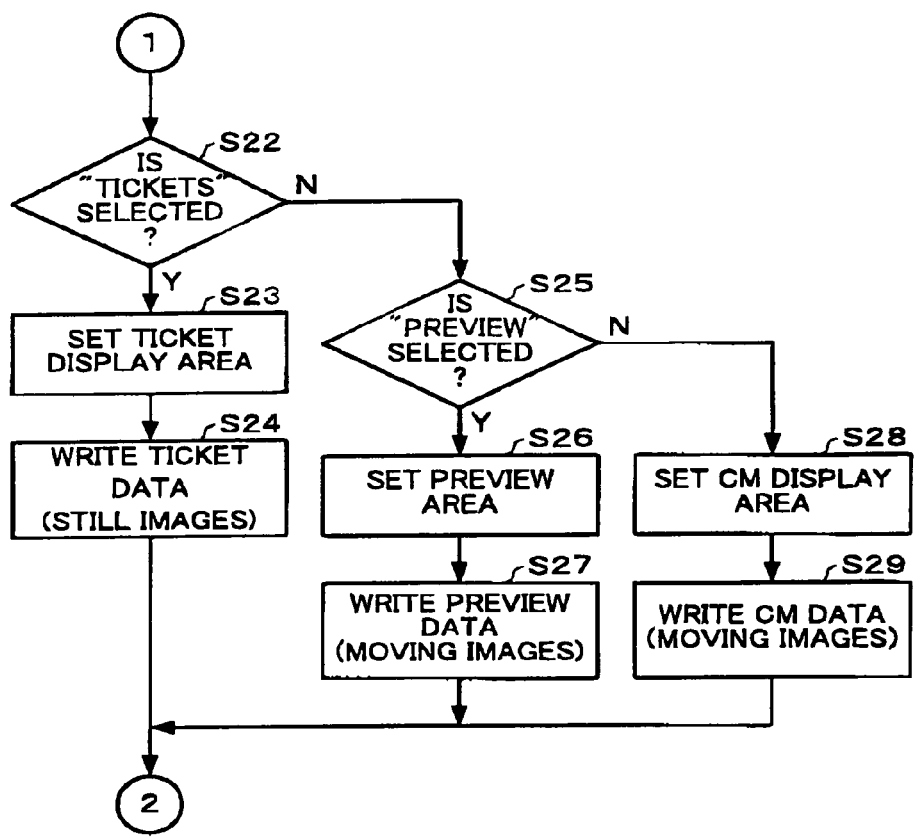
FIG. 11 is a flow chart illustrating the second half of an example of display processing of image information that is a mixture of still images and moving images, in the mobile telephone that is electronic equipment in accordance with the first embodiment of the present invention.

Such electronic equipment is implemented by the execution of programs by the CPU 12, as described below. FIGS. 10 and 11 show an example of the processing of a program that displays contents data that is a mixture of still images and moving images, as described above.

If CPU 12 fetches menu information comprised within contents data from the Internet, a menu display area is set within the display area of the liquid crystal panel 22, based on still-image information for displaying a menu screen by the still-image area setting section 256 (step S10).

Menu data (still-image information) for displaying a menu screen is then written into the storage area of the display data RAM 160 of the X-driver IC 24 that corresponds to the thus-set menu display area, by the still-image setting area 256 (step S11). In other words, transfer to the X-driver IC 24 and write to the display data RAM 160 is controlled by a given command.

Key input is subsequently received through the operation input section 38 from the user (step S12).

As a result, if "1. Story" has been selected from among the selection items of the menu screen by the key input through the operation input section 38 of the user (Y at step S13), the contents server is informed that selection item "1" has been selected and the corresponding contents data (story information) is fetched. This contents data (story information) is still-image information for displaying details of the selected movie story, by way of example.

The still-image area setting section 256 sets a story display area within the display area of the liquid crystal panel 22, based on still-image information for displaying a text screen that displays the story, which is comprised within the fetched contents data (story information) (step S14).

The story information (still-image information) for displaying the selected movie story details is then written by the still-image data write section 258 to the storage area of the display data RAM 160 of the X-driver IC 24 that corresponds to the thus-set story display area (step S15). In other words, transfer to the X-driver IC 24 and write to the display data RAM 160 is controlled by a given command.

Alternatively, if "2. Cast introduction" has been selected in step S13 from among the selection items of the menu screen by the key input through the operation input section 38 of the user (N in step S13 then Y in step S16), the contents server is informed that selection item "2" has been selected and the corresponding contents data (cast introduction information) is fetched. This contents data (cast introduction information) is still-image information for displaying details of the cast of the selected movie, by way of example.

The still-image area setting section 256 sets a cast introduction display area within the display area of the liquid crystal panel 22, based on still-image information for displaying a text screen that displays the cast introduction, which is included within the fetched contents data (cast introduction information) (step S17).

The cast introduction information (still-image information) for displaying the selected movie cast introduction details is then written by the still-image data write section 258 to the storage area of the display data RAM 160 of the X-driver IC 24 that corresponds to the thus-set cast introduction display area (step S18). In other words, transfer to the X-driver IC 24 and write to the display data RAM 160 is controlled by a given command.

If "3. Roadshow locations" has been selected in step S16 from among the selection items of the menu screen by the key input through the operation input section 38 of the user (N in step S16 then Y in step S19), the contents server is informed that selection item "3" has been selected and the corresponding contents data (roadshow location information) is fetched. This contents data (roadshow location information) is still-image information for displaying details specifying the locations such as the regions and theaters when the selected movie is being shown, by way of example.

The still-image area setting section 256 sets a roadshow location display area within the display area of the liquid crystal panel 22, based on still-image information for displaying a text screen that displays roadshow locations, which is included within the fetched contents data (roadshow location information) (step S20).

The roadshow location information (still-image information) for displaying the selected movie roadshow locations is then written by the still-image data write section 258 to the storage area of the display data RAM 160 of the X-driver IC 24 that corresponds to the thus-set roadshow location display area (step S21). In other words, transfer to the X-driver IC 24 and write to the display data RAM 160 is controlled by a given command.

If "4. Tickets" has been selected in step S19 from among the selection items of the menu screen by the key input through the operation input section 38 of the user (N in step S19 then Y in step S22), the contents server is informed that selection item "4" has been selected and the corresponding contents data (ticket information) is fetched. This contents data (ticket information) is still-image information for displaying a guide for reserving theater tickets for the selected movie, by way of example.

The still-image area setting section 256 sets a ticket display area within the display area of the liquid crystal panel 22, based on still-image information for displaying a text screen that displays a ticket reservation guide, which is included within the fetched contents data (ticket information) (step S23).

The ticket information (still-image information) for displaying the guide for reserving cinema tickets for the selected movie is then written by the still-image data write section 258 to the storage area of the display data RAM 160 of the X-driver IC 24 that corresponds to the thus-set ticket display area (step S24). In other words, transfer to the X-driver IC 24 and write to the display data RAM 160 is controlled by a given command.

In this case, if the user reserves tickets in accordance with the displayed ticket reservation guide, ticket reservation processing is done, including the distribution of and payment for tickets that is part of the ticket reservation process in practice.

If "5. Preview" has been selected from among the selection items of the menu screen by the key input through the operation input section 38 of the user (N in step S22 then Y in step S25), the contents server is informed that selection item "5" has been selected and the corresponding contents data (preview information) is fetched. This contents data (preview information) is still-image information for displaying details about preview for the selected movie, by way of example.

The moving-image area setting section 252 sets an preview display area within the liquid crystal panel 22, based on moving-image information for displaying details of preview that is comprised within the fetched contents data (preview information) (step S26).

The preview information (moving-image information) for displaying preview about the selected movie is then written by the moving-image data write section 254 to the storage area of the display data RAM 160 of the X-driver IC 24 that corresponds to the thus-set preview display area (step S27). In other words, an instruction is issued to the DSP 16 to transfer the moving-image data to be written to the X-driver IC 24, and the data is written to the display data RAM 160.

If "5. Preview" is not selected from the selection items of the menu screen by the key input through the operation input section 38 of the user in step S25 (N in step S25), display processing is performed on moving-image information with the objective of publicity advertisement distributed from the contents server over the Internet.

In other words, a commercial (CM) display area is set within the display area of the liquid crystal panel 22 by the moving-image area setting section 252, from moving-image information for publicity advertisements that is comprised within the fetched contents data (step S28). This CM display area could be an area specified by the moving-image information for publicity advertisements comprised within the fetched contents data, or it could be an area specified by the user.

The fetched CM information (moving-image information) for publicity advertisement is then written by the moving-image data write section 254 to the storage area in the display data RAM 160 of the X-driver IC 24 corresponding to the thus-set CM display area (step S29). In other words, an instruction is issued to the DSP 16 to transfer the moving-image data to be written to the X-driver IC 24, and the data is written to the display data RAM 160.

If still-image data or moving-image data is written to the display data RAM 160 in step S15, S18, S21, S24, S27, or S29, the display of the display section comprising the liquid crystal panel 22 is driven by the X-driver IC 24 and thus contents that are a mixture of still images and moving images are displayed.

When the contents service subsequently ends (Y in step S30, the series of display processing ends. If the contents service does not end (N in step S30), the flow returns to step S10 and the menu display.

Figure 12:
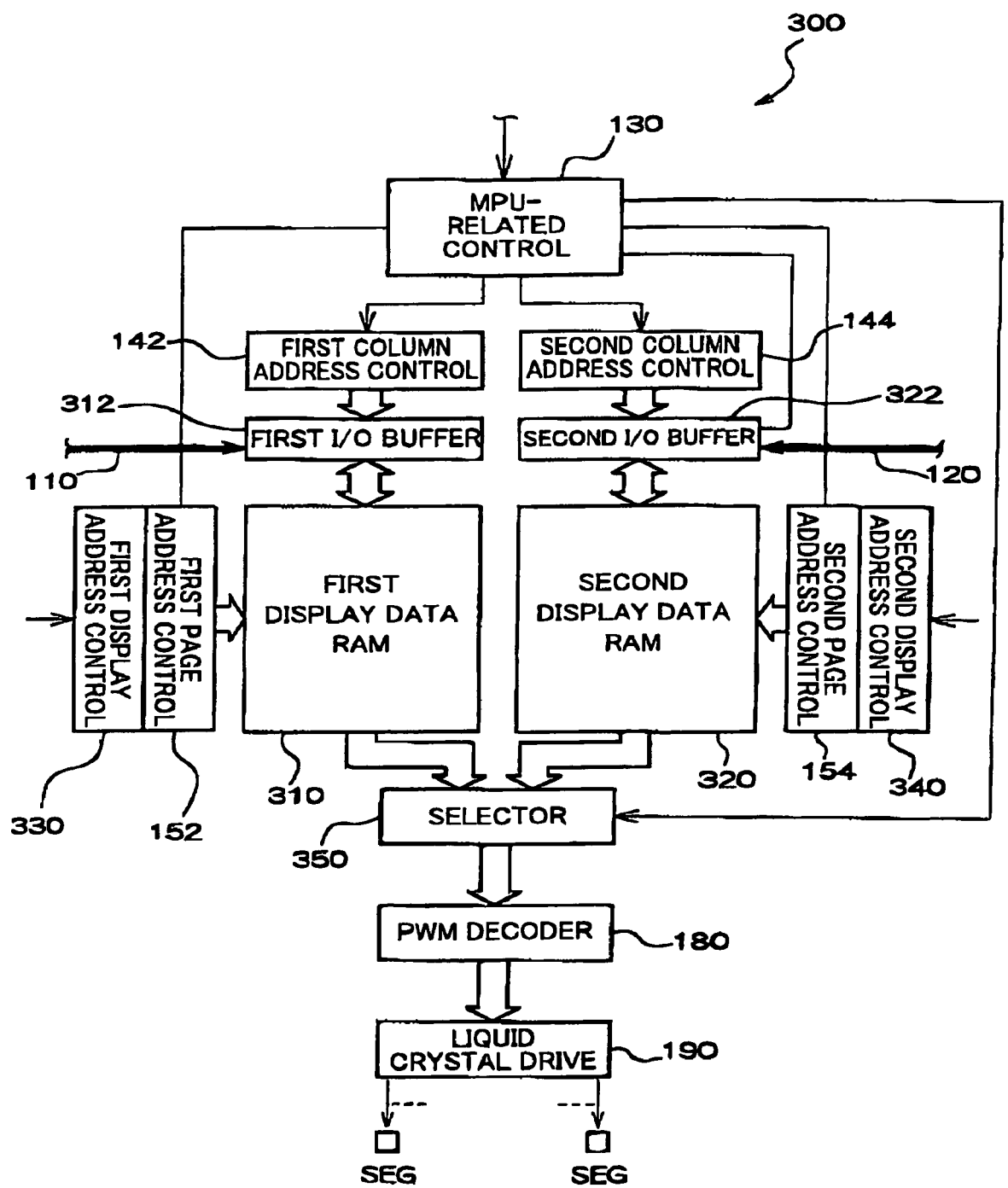
FIG. 12 is a schematic block diagram of an X-driver IC in accordance with the second embodiment of the present invention.

The X-driver IC 24 in accordance with the first embodiment of the present invention makes it possible to write still-image data and moving-image data by separate systems, where the display data RAM 160 is configured of three-port memory cells, but the present invention is not limited thereto. FIG. 12 shows an exemplary block diagram of part of an X-driver IC 300 in accordance with a second embodiment of the present invention. Note that circuits in FIG. 12 that have the same functions as circuits in FIG. 4 are denoted by the same reference numbers and further description thereof is omitted. The circuits omitted from FIG. 12 are similar to those of FIG. 4.

The first way in which the X-driver IC 300 of FIG. 12 differs from the X-driver IC 24 of FIG. 4 is the provision of first and second display data RAMs 310 and 320. Still-image data is stored in the first RAM 310 and moving-image data is stored in the second RAM 320. Note that the first and second RAM portions 310 and 320 do not need the second word line W2, the second bit line pair B2 and $\overline{B2}$, the second column switch SW2, the second column address decoder 144A, and the second page address decoder 154A of FIG. 6, so memory cells of a prior-art configuration can be used therefore.

Figure 13:
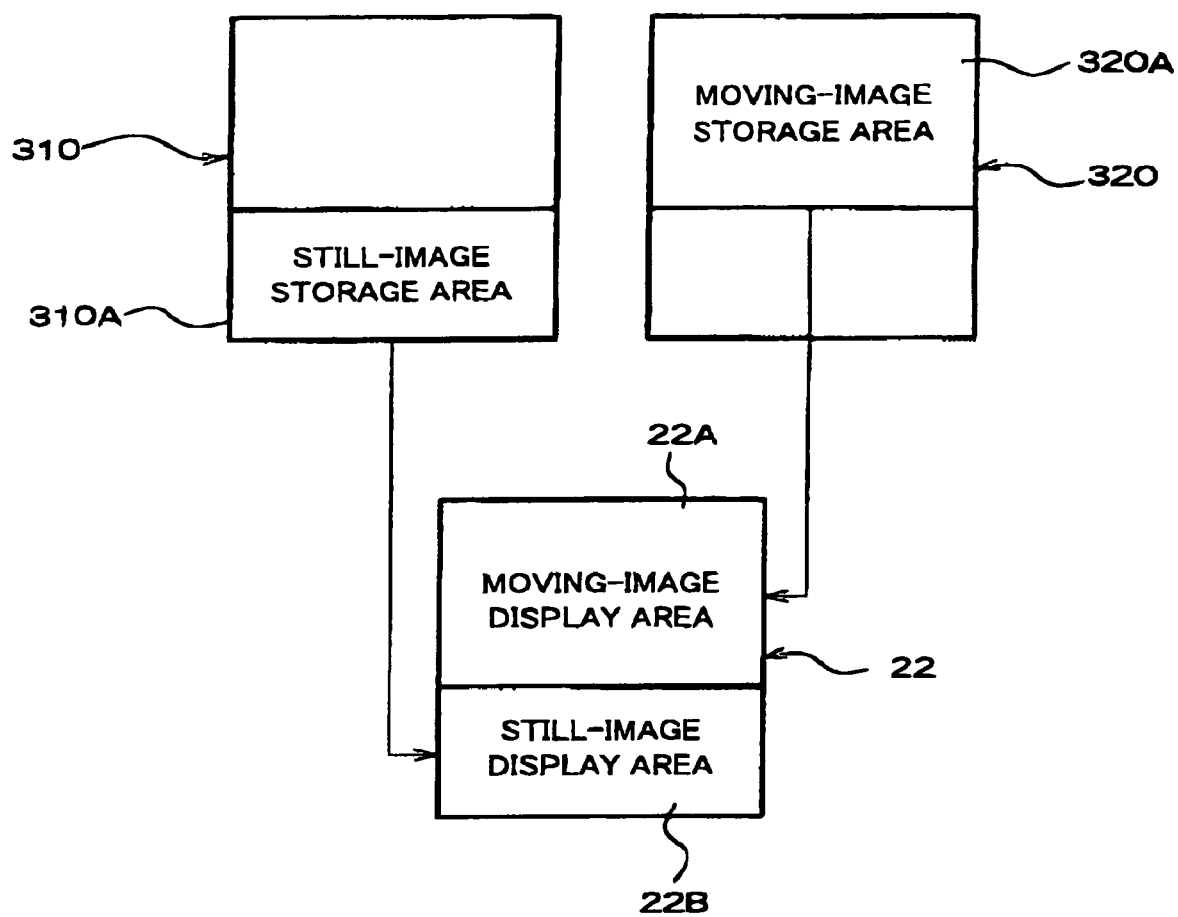
FIG. 13 is a schematic illustrative diagram of the relationship between storage areas of the first and second display data RAM of FIG. 12 and the display areas of the liquid crystal panel.

FIG. 13 shows the relationships between a still-image storage area 310A of the first display data RAM 310, a moving-image storage area 320A of the second display data RAM 320, and the moving-image display area 22A and still-image display area 22B of the liquid crystal panel 22. The first and second display data RAMs 310 and 320 have storage areas corresponding to all the pixels of one screen of the liquid crystal panel 22. This makes it possible to vary the still-image storage area 310A and the moving-image storage area 320A of FIG. 13 as desired. Note that the memory spaces of the first and second display data RAMs 310 and 320 and the display space of the liquid crystal panel 22 are drawn to be the same size in FIG. 13, to facilitate description.

Data is written to the moving-image storage area 320A of the second display data RAM 320 at a frame rate of 20 frames per second, by way of example, and data is read therefrom at a frame rate of 60 frames per second and is displayed on the moving-image display area 22A of the liquid crystal panel 22. Conversely, data is written to the still-image storage area 310A of the first display data RAM 310 at a frame rate of 90 frames per second, by way of example, and is data is read therefrom at a frame rate of 60 frames per second and is displayed on the still-image display area 22B of the liquid crystal panel 22.

Thus the second embodiment differs from the first embodiment in the provision of the first and second display data RAMs 310 and 320. For that reason, the first column address control circuit 142, a first I/O buffer 312, the first page address control circuit 152, and a first display address control circuit 330 are provided to correspond to the first display data RAM 310. Similarly, the second column address control circuit 144, a second I/O buffer 322, the second page address control circuit 154, and a second display address control circuit 340 are provided to correspond to the second display data RAM 320.

A selector 350 can also provided to select display data from the first and second display data RAMs 310 and 320 on the basis of an output from the MPU-related control circuit 130, for output to the PWM decoder circuit 180.

Also in the second embodiment, still images and moving images are transferred by separate systems over the first and second bus lines 110 and 120. In addition, column and page addresses for writing data to the first and second RAMs 310 and 320 are also specified by different systems for still images and moving images. For that reason, it is not necessary to wait for the writing of moving-image data to finish before writing still-image data, when still-image data is being rewritten into the first RAM 310 simultaneously with the rewriting of moving-image data into the second RAM 320.

It is to be understood that the present invention is not limited to the embodiments described above, and thus various modifications are possible without departing from the spirit and scope of the present invention. Similarly, the present invention has been described with reference to electronic equipment that receives a contents service that provides movie information, but it is not limited thereto.

What is claimed is:

1. A RAM-incorporated driver that drives a display section, based on a command from an external MPU, and still-image data and moving-image data, the RAM-incorporated driver comprising:
   a first bus line that transfers the still-image data from the external MPU;
   a second bus line that transfers the moving-image data from the external MPU;
   a RAM that stores the still-image data and the moving-image data;
   a first column address control circuit that specifies a column address in the RAM for writing the still-image data;
   a second column address control circuit that specifies a column address in the RAM for writing the moving-image data;
   a first page address control circuit that specifies a page address in the RAM for writing the still-image data;
   a second page address control circuit that specifies a page address in the RAM for writing the moving-image data;
   an MPU-related control circuit that controls the first and second column address control circuits and the first and second page address control circuits, based on the command from the external MPU;
   a display address control circuit that controls reading of the still-image data and the moving-image data stored in the RAM, as display data; and
   a driver-related control circuit that controls the display address control circuit independently of the MPU-related control circuit.

2. The RAM-incorporated driver as defined by claim 1, further comprising:
   a first pair of bit lines connected to a memory cell of the RAM;
   a second pair of bit lines connected to a memory cell of the RAM;
   a first column switch controlled by the first column address control circuit and connecting the first pair of bit lines with the first bus line;
   a second column switch controlled by the second column address control circuit and connecting the second pair of bit lines with the second bus line;
   a first word line which transfers a signal from the first page address control circuit to a control terminal of a first switch provided between a memory element within the memory cell and the first pair of bit lines; and
   a second word line which transfers a signal from the second page address control circuit to a control terminal of a second switch provided between the memory element and the second pair of bit lines.

3. The RAM-incorporated driver as defined by claim 2, wherein the RAM has a first RAM which stores the still-image data that has been transferred via the first bus line and a second RAM which stores the moving-image data that has been transferred via the second bus line,
   wherein the display address control circuit further comprises a first display address control circuit which controls the reading of still-image data from the first RAM as display data and a second display address control circuit which controls the reading of moving-image from the second RAM as display data,
   wherein, in the first RAM, write addresses are controlled by the first column address control circuit and the first page address control circuit, and
   wherein, in the second RAM, write addresses are controlled by the second column address control circuit and the second page address control circuit.

4. The RAM-incorporated driver as defined by claim 3 wherein the first column address control circuit specifies a read column address in the RAM based on a signal from the MPU-related control circuit, and
   wherein the first page address control circuit specifies a read page address in the RAM based on a signal from the MPU-related control circuit.

5. A display unit comprising:
   a panel having an electro-optical element driven by a plurality of first electrodes and a plurality of second electrodes;
   the RAM-incorporated driver, as defined by claim 4, which drives the plurality of first electrodes; and
   a scanning driver which scans and drives the plurality of second electrodes.

6. A display unit comprising:
   a panel having an electro-optical element driven by a plurality of first electrodes and a plurality of second electrodes;
   the RAM-incorporated driver, as defined by claim 3, which drives the plurality of first electrodes; and a scanning driver which scans and drives the plurality of second electrodes.

7. The RAM-incorporated driver as defined by claim 2 wherein the first column address control circuit specifies a read column address in the RAM based on a signal from the MPU-related control circuit, and wherein the first page address control circuit specifies a read page address in the RAM based on a signal from the MPU-related control circuit.

8. A display unit comprising:

a panel having an electro-optical element driven by a plurality of first electrodes and a plurality of second electrodes;

the RAM-incorporated driver, as defined by claim 7, which drives the plurality of first electrodes; and a scanning driver which scans and drives the plurality of second electrodes.

9. A display unit comprising:

a panel having an electro-optical element driven by a plurality of first electrodes and a plurality of second electrodes;

the RAM-incorporated driver, as defined by claim 2, which drives the plurality of first electrodes; and a scanning driver which scans and drives the plurality of second electrodes.

10. The RAM-incorporated driver as defined by claim 1 wherein the first column address control circuit specifies a read column address in the RAM based on a signal from the MPU-related control circuit, and wherein the first page address control circuit specifies a read page address in the RAM based on a signal from the MPU-related control circuit.

11. A display unit comprising:

a panel having an electro-optical element driven by a plurality of first electrodes and a plurality of second electrodes;

the RAM-incorporated driver, as defined by claim 1, which drives the plurality of first electrodes; and a scanning driver which scans and drives the plurality of second electrodes.

12. A display unit comprising:

a panel having an electro-optical element driven by a plurality of first electrodes and a plurality of second electrodes;

the RAM-incorporated driver, as defined by claim 10, which drives the plurality of first electrodes; and a scanning driver which scans and drives the plurality of second electrodes.

* * * * *